United States Patent
Chen et al.

(10) Patent No.: US 10,693,490 B1
(45) Date of Patent: Jun. 23, 2020

(54) SIGMA-DELTA ANALOG-TO-DIGITAL CONVERTER AND OPERATION METHOD THEREOF

(71) Applicant: Faraday Technology Corp., Hsinchu (TW)

(72) Inventors: Chiao-Min Chen, Kaohsiung (TW); Min-Yuan Wu, Hsinchu (TW); Shih-Yi Shih, Hsinchu (TW); Po-Liang Chen, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/529,765

(22) Filed: Aug. 1, 2019

(30) Foreign Application Priority Data

Apr. 24, 2019 (TW) .............................. 108114324 A

(51) Int. Cl.
*H03M 3/00* (2006.01)
(52) U.S. Cl.
CPC ............. *H03M 3/32* (2013.01); *H03M 3/458* (2013.01)
(58) Field of Classification Search
CPC .................................................... H03M 1/468
USPC ................................. 341/140–166
See application file for complete search history.

(56) References Cited

U.S. PATENT DOCUMENTS

| | | | |
|---|---|---|---|
| 5,627,536 A | 5/1997 | Ramirez | |
| 6,556,159 B1 * | 4/2003 | Fei | H03M 7/3011 341/143 |
| 6,803,869 B1 * | 10/2004 | Melanson | G11B 20/10527 341/143 |
| 7,173,550 B1 * | 2/2007 | Melanson | G11B 20/10527 341/118 |
| 7,183,954 B1 * | 2/2007 | Melanson | H03M 7/3015 341/143 |
| 7,561,088 B1 | 7/2009 | Ferguson | |
| 9,900,023 B1 * | 2/2018 | Kinyua | H03M 3/46 |
| 10,062,391 B2 | 8/2018 | Yamamoto | |
| 10,164,653 B1 * | 12/2018 | Kinyua | H03M 1/50 |
| 10,200,054 B1 * | 2/2019 | Jasa | H03M 3/50 |

(Continued)

FOREIGN PATENT DOCUMENTS

| | | |
|---|---|---|
| WO | 2007120400 | 10/2007 |
| WO | 2010098918 | 9/2010 |

OTHER PUBLICATIONS

"Office Action of Taiwan Counterpart Application," dated Nov. 4, 2019, p. 1-p. 14.

*Primary Examiner* — Lam T Mai
(74) *Attorney, Agent, or Firm* — Winston Hsu

(57) ABSTRACT

A Sigma-Delta ($\Sigma$-$\Delta$) analog-to-digital converter (ADC) and operation method thereof are provided. The $\Sigma$-$\Delta$ ADC includes a $\Sigma$-$\Delta$ modulator, a dynamic element matching (DEM) circuit and a control circuit. An input terminal of the $\Sigma$-$\Delta$ modulator is configured to receive an analog signal. The $\Sigma$-$\Delta$ modulator is configured to convert the analog signal into a digital signal based on a feedback signal. The DEM circuit is coupled to the $\Sigma$-$\Delta$ modulator to receive the digital signal. The DEM circuit is configured to perform a DEM algorithm on the digital signal to generate a feedback signal, and provide the feedback signal to the $\Sigma$-$\Delta$ modulator. The control circuit listens to the digital signal to detect a mute period. The control circuit disables the DEM circuit during the mute period to suspend a progress of the DEM algorithm.

28 Claims, 4 Drawing Sheets

(56) References Cited

U.S. PATENT DOCUMENTS

| | | | | |
|---|---|---|---|---|
| 2011/0148678 A1* | 6/2011 | Hu | ..................... | H03M 1/0668 341/143 |
| 2012/0275493 A1* | 11/2012 | Fortier | ................... | H03F 3/217 375/219 |
| 2019/0288655 A1* | 9/2019 | Zou | ..................... | H03F 3/45475 |

\* cited by examiner

SIGMA-DELTA ANALOG-TO-DIGITAL CONVERTER AND OPERATION METHOD THEREOF

CROSS-REFERENCE TO RELATED APPLICATION

This application claims the priority benefit of Taiwan application serial no. 108114324, filed on Apr. 24, 2019. The entirety of the above-mentioned patent application is hereby incorporated by reference herein and made a part of this specification.

BACKGROUND

Technical Field

The invention relates to an Analog-to-Digital Converter (ADC), and particularly relates to a Sigma-Delta (which is referred to as $\Sigma$-$\Delta$ hereinafter) ADC and an operation method thereof.

Description of Related Art

Analog-to-Digital Converters (ADC) are widely applied to various electronic devices (for example, communication devices, consumer electronic products, audio equipment, etc.). However, in internal of an ADC, there is inevitably a nonlinear problem caused by component mismatch. Such problem is especially important for a $\Sigma$-$\Delta$ modulator. A Dynamic Element Matching (DEM) technique may resolve the nonlinear problem of the ADC. A general DEM circuit may perform a Data Weighted Averaging (DWA) algorithm to provide a feedback signal (a digital code) to the $\Sigma$-$\Delta$ modulator. Generally, advantages of the DWA algorithm are as follows: a first-order noise shaping may be achieved; which may reduce a component mismatch effect inside the ADC; in view of Signal-to-Noise Ratio (SNR) and Total Harmonic Distortion (THD), it has a better performance because it may reduce a capacitance mismatch phenomenon at an input terminal of an analog part (for example, a Switched-Capacitor reconstruction Filter (SCF) of the ADC. However, the DWA algorithm still has problems required to be resolved. For example, the DWA algorithm may probably produce an in-band tone, so that a Spur-Free Dynamic Range (SFDR) performance may be poor.

Moreover, when an analog signal input to the ADC is in a mute period, the general DEM circuit still keeps running the DWA algorithm to disturb the feedback signal (digital code). However, regarding the analog signal in the mute period, the power required for running the DWA algorithm by the DEM circuit is meaningless.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention is directed to a Sigma-Delta (which is referred to as $\Sigma$-$\Delta$ hereinafter) Analog-to-Digital Converter (ADC) and an operation method thereof, which are adapted to reduce power consumption of a Dynamic Element Matching (DEM) circuit during a mute period.

An embodiment of the invention provides a $\Sigma$-$\Delta$ ADC, and the $\Sigma$-$\Delta$ ADC includes a $\Sigma$-$\Delta$ modulator, a DEM circuit, and a control circuit. An input terminal of the $\Sigma$-$\Delta$ modulator is configured to receive an analog signal. The $\Sigma$-$\Delta$ modulator is configured to convert the analog signal into a digital signal according to a feedback signal. The DEM circuit is coupled to the $\Sigma$-$\Delta$ modulator to receive the digital signal. The DEM circuit is configured to perform at least one DEM algorithm on the digital signal to generate the feedback signal, and provide the feedback signal to the $\Sigma$-$\Delta$ modulator. The control circuit is coupled to the $\Sigma$-$\Delta$ modulator to receive the digital signal. The control circuit listens to the digital signal to detect a mute period. The control circuit disables the DEM circuit during the mute period to suspend a progress of the at least one DEM algorithm.

An embodiment of the invention provides an operation method of a $\Sigma$-$\Delta$ ADC. The operation method includes: converting an analog signal into a digital signal by a $\Sigma$-$\Delta$ modulator according to a feedback signal; performing at least one DEM algorithm on the digital signal by a DEM circuit to generate the feedback signal; providing the feedback signal to the $\Sigma$-$\Delta$ modulator by the DEM circuit; listening to the digital signal by a control circuit to detect a mute period; and disabling the DEM circuit by the control circuit during the mute period to suspend a progress of the at least one DEM algorithm.

An embodiment of the invention provides a $\Sigma$-$\Delta$ ADC, and the $\Sigma$-$\Delta$ ADC includes a $\Sigma$-$\Delta$ modulator, a first DEM circuit, a second DEM circuit and a switching circuit. An input terminal of the $\Sigma$-$\Delta$ modulator is configured to receive an analog signal. The $\Sigma$-$\Delta$ modulator is configured to convert the analog signal into a digital signal according to a feedback signal. An input terminal of the first DEM circuit is coupled to the $\Sigma$-$\Delta$ modulator to receive the digital signal. The first DEM circuit is configured to perform a first DEM algorithm on the digital signal to generate a first feedback signal. An input terminal of the second DEM circuit is coupled to the $\Sigma$-$\Delta$ modulator to receive the digital signal. The second DEM circuit is configured to perform a second DEM algorithm different to the first DEM algorithm on the digital signal to generate a second feedback signal. A common terminal of the switching circuit is coupled to the $\Sigma$-$\Delta$ modulator to provide the feedback signal. A first selection terminal of the switching circuit is coupled to the first DEM circuit to receive the first feedback signal. A second selection terminal of the switching circuit is coupled to the second DEM circuit to receive the second feedback signal.

An embodiment of the invention provides an operation method of a $\Sigma$-$\Delta$ ADC. The operation method includes: converting an analog signal into a digital signal by a $\Sigma$-$\Delta$ modulator according to a feedback signal; performing a first DEM algorithm on the digital signal by a first DEM circuit to generate a first feedback signal; performing a second DEM algorithm different to the first DEM algorithm on the digital signal by a second DEM circuit to generate a second feedback signal; and dynamically selecting one of the first feedback signal and the second feedback signal by the switching circuit to serve as the feedback signal.

Based on the above description, in some embodiments of the invention, the $\Sigma$-$\Delta$ ADC and the operation method thereof are capable of disabling the DEM circuit during the mute period, so as to suspend the progress of the DEM algorithm. Therefore, the power consumption of the DEM circuit during the mute period is decreased. In some other embodiments of the invention, the $\Sigma$-$\Delta$ ADC and the operation method thereof are capable of performing two (or more) DEM algorithms to generate two (or more) feedback signals. The Σ-Δ ADC dynamically selects (switches) one of the feedback signals to the Σ-Δ modulator (i.e. the feedback signal received by the Σ-Δ modulator is mixed with output codes of different DEM algorithms). Therefore, compared to the general Σ-Δ ADC, a Spur-Free Dynamic Range (SFDR) performance of the Σ-Δ ADC of the embodiment of the invention is better.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
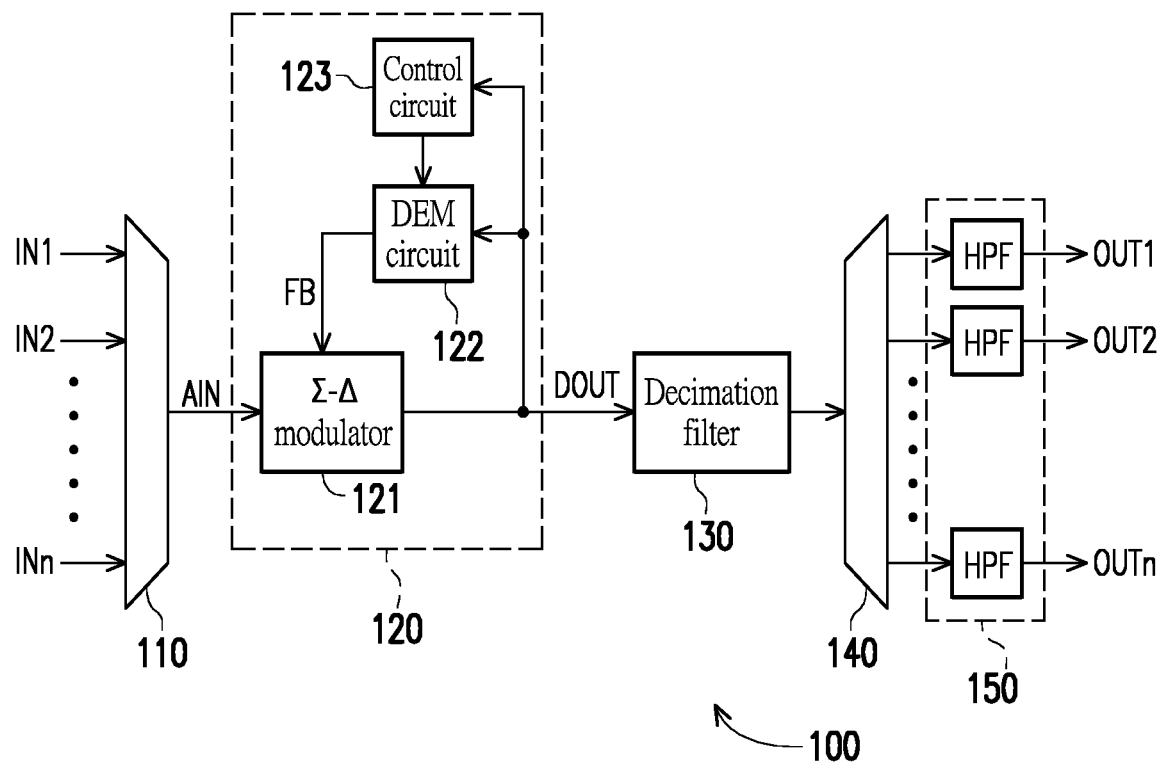
FIG. 1 is a circuit block schematic diagram of a multi-channel Sigma-Delta (which is referred to as Σ-Δ hereinafter) Analog-to-Digital Converter (ADC) device according to an embodiment of the invention.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a circuit block schematic diagram of a multi-channel Sigma-Delta (which is referred to as Σ-Δ hereinafter) Analog-to-Digital Converter (ADC) device 100 according to an embodiment of the invention. The multi-channel Σ-Δ ADC device 100 may be applied to a surveillance system with multiple audio and video channels (multiple surveillance cameras). As shown in FIG. 1, the multi-channel Σ-Δ ADC device 100 includes a multiplexer 110, a Σ-Δ ADC 120, a decimation filter 130, a de-multiplexer 140 and a High Pass Filter (HPF) 150. N selection terminals of the multiplexer 110 receive a plurality of analog signals (for example, audio signals) IN1, IN2, . . . , INn from different channels, where the number n of the channels may be determined according to an actual design requirement.

An input terminal of the Σ-Δ ADC 120 is coupled to a common terminal of the multiplexer 110 to receive the analog signal AIN. The Σ-Δ ADC 120 may convert the analog signal into a digital signal. An input terminal of the decimation filter 130 is coupled to an output terminal of the Σ-Δ ADC 120 to receive a digital signal DOUT. According to a design requirement, the decimation filter 130 may be a Cascaded Integrator-Comb (CIC) filter or other filter. A common terminal of the de-multiplexer 140 is coupled to an output terminal of the decimation filter 130. N selection terminals of the de-multiplexer 140 provide a plurality of digital signals (for example, audio signals) OUT1, OUT2, . . . OUTn to different channels through the HPF 150. Therefore, multiple channels may share the single Σ-Δ ADC 120 in time division manner.

In the embodiment of FIG. 1, the Σ-Δ ADC 120 includes a Σ-Δ modulator 121, a Dynamic Element Matching (DEM) circuit 122, and a control circuit 123. An input terminal of the Σ-Δ modulator 121 receives the analog signal AIN from the multiplexer 110. The Σ-Δ modulator 121 may convert the analog signal AIN into the digital signal DOUT according to a feedback signal FB. The digital signal DOUT is transmitted to the input terminal of the decimation filter 130. According to a design requirement, the Σ-Δ modulator 121 may be a general (or conventional) Σ-Δ modulator or other Σ-Δ modulator.

Figure 2:
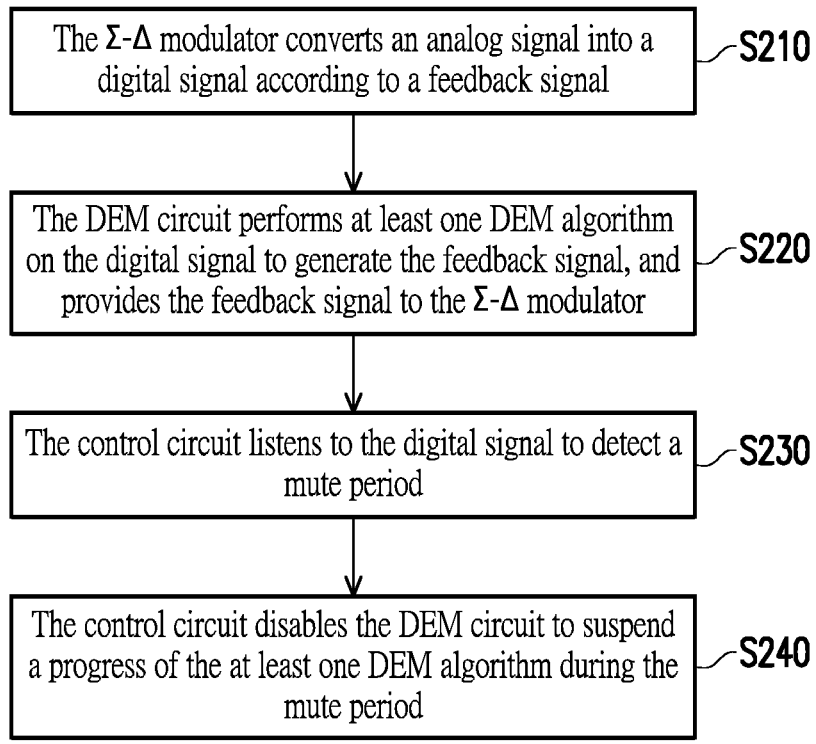
FIG. 2 is a flowchart illustrating an operation method of the Σ-Δ ADC according to an embodiment of the invention.

FIG. 2 is a flowchart illustrating an operation method of the Σ-Δ ADC 120 according to an embodiment of the invention. Referring to FIG. 1 and FIG. 2, in a step S210, the Σ-Δ modulator 121 converts the analog signal AIN into the digital signal DOUT according to the feedback signal FB. The DEM circuit 122 is coupled to the Σ-Δ modulator 121 to receive the digital signal DOUT. In a step S220, the DEM circuit 122 performs at least one DEM algorithm on the digital signal DOUT to generate the feedback signal FB. According to a design requirement, the at least one DEM algorithm includes a Data Weighted Averaging (DWA) algorithm, a tree structured algorithm or other DEM algorithm. The DWA algorithm and the tree structured algorithm are well-known knowledge, which are not repeated. The DEM circuit 122 may provide the feedback signal FB to the Σ-Δ modulator 121 in the step S220.

The control circuit 123 is coupled to the Σ-Δ modulator 121 to receive the digital signal DOUT. In a step S230, the control circuit 123 listens to the digital signal DOUT to detect a mute period. For example, when the digital signal DOUT is kept to a certain digital code (for example, a median value in a value range of the digital signal DOUT) within a period of time, the control circuit 123 may determine that the digital signal DOUT is in the mute period (i.e. the analog signal AIN is in the mute period).

In the mute period, the control circuit 123 disables the DEM circuit to suspend a progress of the at least one DEM algorithm (step S240). Therefore, the power consumption of the DEM circuit 122 may be decreased during the mute period. After the mute period is ended, the control circuit 123 may enable the DEM circuit 122 to restore the progress of the at least one DEM algorithm.

Figure 3:
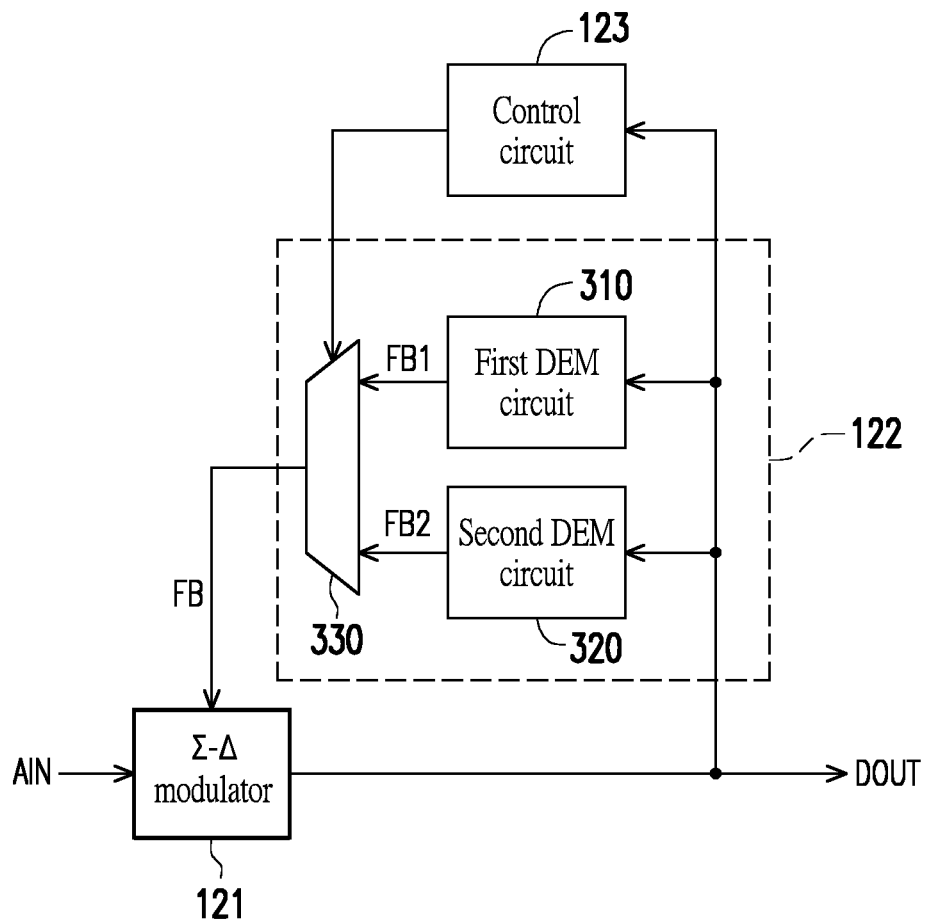
FIG. 3 is a circuit block schematic diagram of a Dynamic Element Matching (DEM) circuit of FIG. 1 according to an embodiment of the invention.

FIG. 3 is a circuit block schematic diagram of the DEM circuit 122 of FIG. 1 according to an embodiment of the invention. As shown in FIG. 3, the DEM circuit 122 includes a first DEM circuit 310, a second DEM circuit 320 and a switching circuit 330. In the embodiment of FIG. 3, the DEM circuit 122 is configured with two DEM circuits 310 and 320, but implementation of the DEM circuit 122 is not limited thereto. According to a design requirement, in other embodiments, the DEM circuit 122 may be configured with three (or more) DEM circuits.

Figure 4:
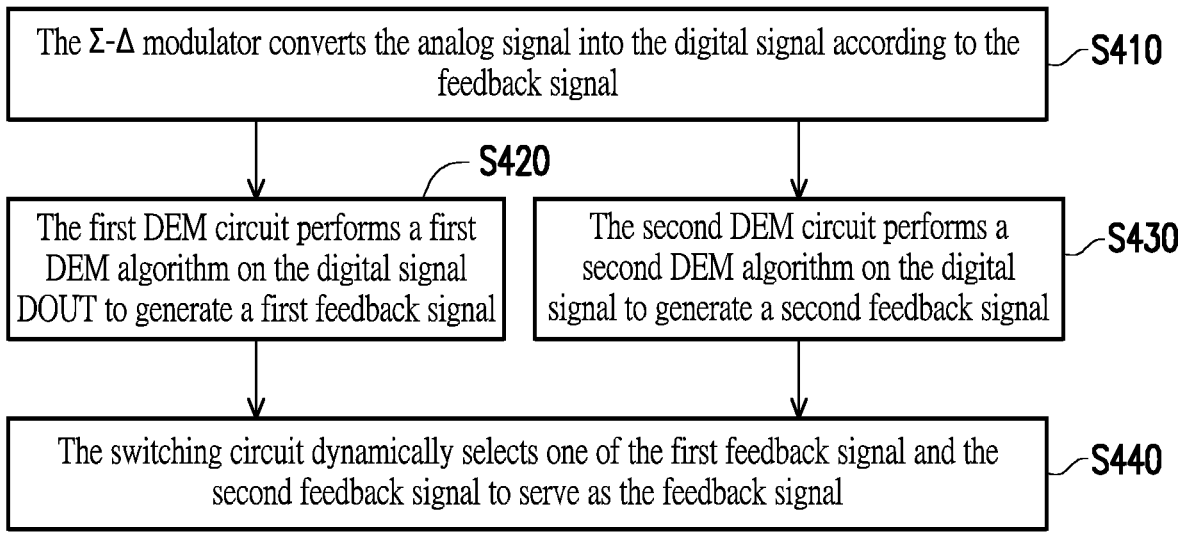
FIG. 4 is a flowchart illustrating an operation method of the Σ-Δ ADC according to an embodiment of the invention.

FIG. 4 is a flowchart illustrating an operation method of the Σ-Δ ADC 120 according to an embodiment of the invention. Referring to FIG. 3 and FIG. 4, in a step S410, the Σ-Δ modulator 121 converts the analog signal AIN into the digital signal DOUT according to the feedback signal FB. An input terminal of the first DEM circuit 310 is coupled to the Σ-Δ modulator 121 to receive the digital signal DOUT. In a step S420, the first DEM circuit 310 performs a first DEM algorithm on the digital signal DOUT to generate a first feedback signal FB1. An input terminal of the second DEM circuit 320 is coupled to the Σ-Δ modulator 121 to receive the digital signal DOUT. In a step S430, the second DEM circuit 320 performs a second DEM algorithm (which is different to the first DEM algorithm) on the digital signal DOUT to generate a second feedback signal FB2.

The first DEM algorithm and the second DEM algorithm may be selected according to a design requirement. For example, the first DEM algorithm may include a bit continuity algorithm, and the second DEM algorithm may include a bit dispersion algorithm. The bit continuity algorithm may include the DWA algorithm or other algorithm, and the bit dispersion algorithm may include the tree structured algorithm or other algorithm.

A common terminal of the switching circuit 330 is coupled to the Σ-Δ modulator 121 to provide the feedback signal FB. A first selection terminal of the switching circuit 330 is coupled to the first DEM circuit 310 to receive the first feedback signal FB1. A second selection terminal of the switching circuit 330 is coupled to the second DEM circuit 320 to receive the second feedback signal FB2. The switching circuit 330 may be a switch, a multiplexer or other routing circuit/element. The switching circuit 330 is controlled by the control circuit 123 to dynamically select one of the first feedback signal FB1 and the second feedback signal FB2 to serve as the feedback signal FB (step S440). The control circuit 123 may control a switching operation of the switching circuit 330 according to a predetermined switching rule. The predetermined switching rule may be determined according to a design requirement.

Figure 5:
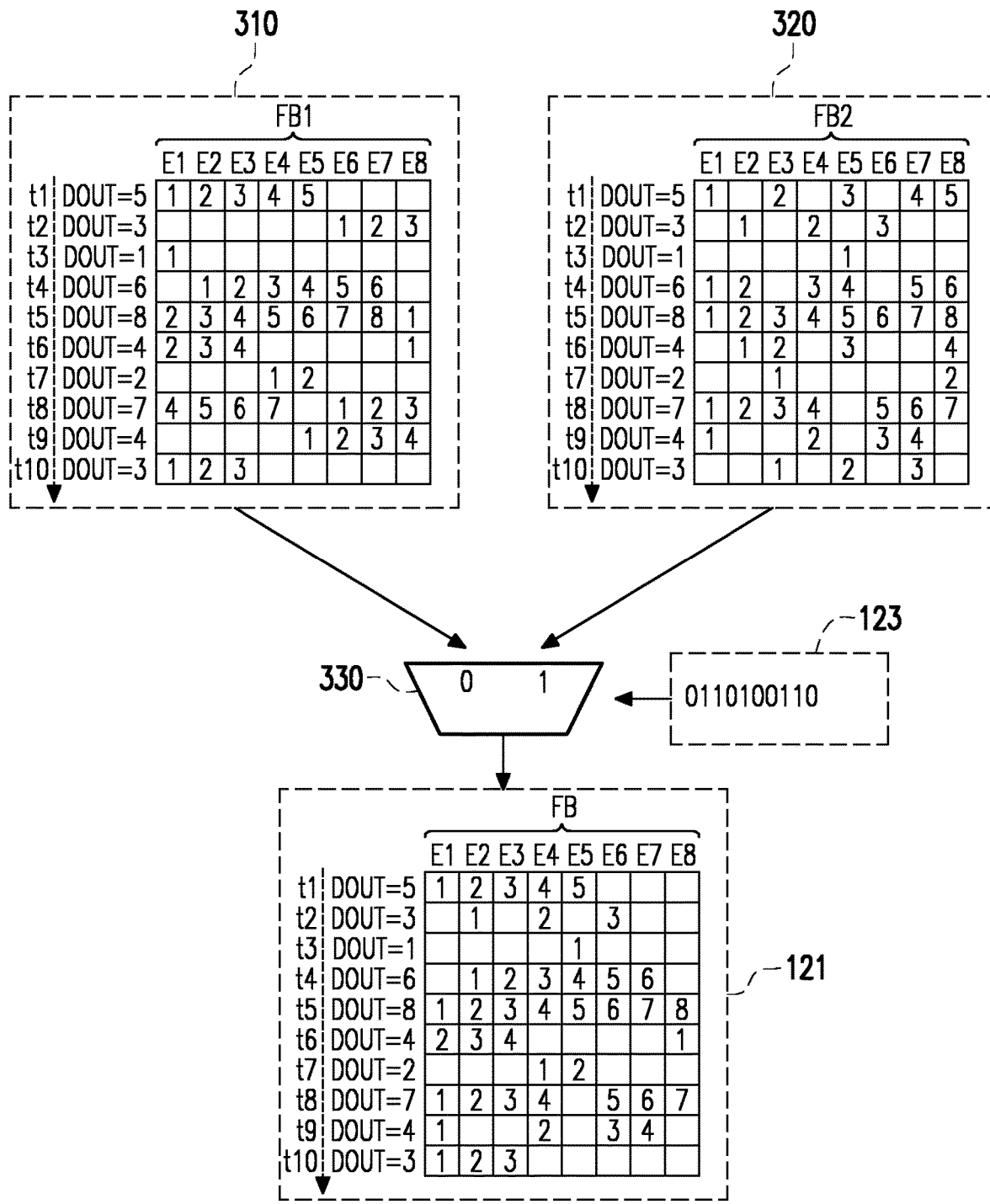
FIG. 5 is a schematic diagram of a switching operation of a switching circuit of FIG. 3 according to an embodiment of the invention.

FIG. 5 is a schematic diagram of a switching operation of the switching circuit 330 of FIG. 3 according to an embodiment of the invention. In the embodiment of FIG. 5, the first DEM algorithm performed by the first DEM circuit 310 is assumed to be the general DWA algorithm, and the second DEM algorithm performed by the second DEM circuit 320 is assumed to be the general tree structured algorithm. As shown in FIG. 5, the first DEM circuit 310 may respectively perform the DWA algorithm on the digital signal DOUT at time points t1, t2, t3, t4, t5, t6, t7, t8, t9 and t10 to generate the first feedback signal FB1. In the embodiment of FIG. 5, the first feedback signal FB1 has a bit E1, a bit E2, a bit E3, a bit E4, a bit E5, a bit E6, a bit E7 and a bit E8. The second DEM circuit 320 may respectively perform the tree structured algorithm on the digital signal DOUT at time points t1-t10 to generate the second feedback signal FB2. In the embodiment of FIG. 5, the second feedback signal FB2 has bits E1-E8. In the table shown in FIG. 5, squares filled with digits represent that logical values of the corresponding bits are "true", and blank squares represent that the logical values of the corresponding bits are "false".

The control circuit 123 may control the switching operation of the switching circuit 330 according to the predetermined switching rule. Based on the control of the control circuit 123, the switching circuit 330 may dynamically select one of the first feedback signal FB1 and the second feedback signal FB2 to serve as the feedback signal FB. For example, in the embodiment of FIG. 5, the switching circuit 330 selects the first feedback signal FB1 to serve as the feedback signal FB at the time point t1, selects the second feedback signal FB2 to serve as the feedback signal FB at the time point t2, selects the second feedback signal FB2 to serve as the feedback signal FB at the time point t3, and selects the first feedback signal FB1 to serve as the feedback signal FB at the time point t4.

The first DEM algorithm performed by the first DEM circuit 310 and the second DEM algorithm performed by the second DEM circuit 320 may be different complementary algorithms. The first DEM algorithm may include the bit continuity algorithm, and the second DEM algorithm may include the bit dispersion algorithm. The switching circuit 330 may dynamically select (switch) one of the first feedback signal FB1 generated based on the first DEM algorithm and the second feedback signal FB2 generated based on the second DEM algorithm to the Σ-Δ modulator 121. Namely, the feedback signal FB received by the Σ-Δ modulator 121 is mixed with output codes of different DEM algorithms. Therefore, compared to a general Σ-Δ ADC, a Spur-Free Dynamic Range (SFDR) performance of the Σ-Δ ADC 120 of the embodiment of the invention is better.

Figure 6:
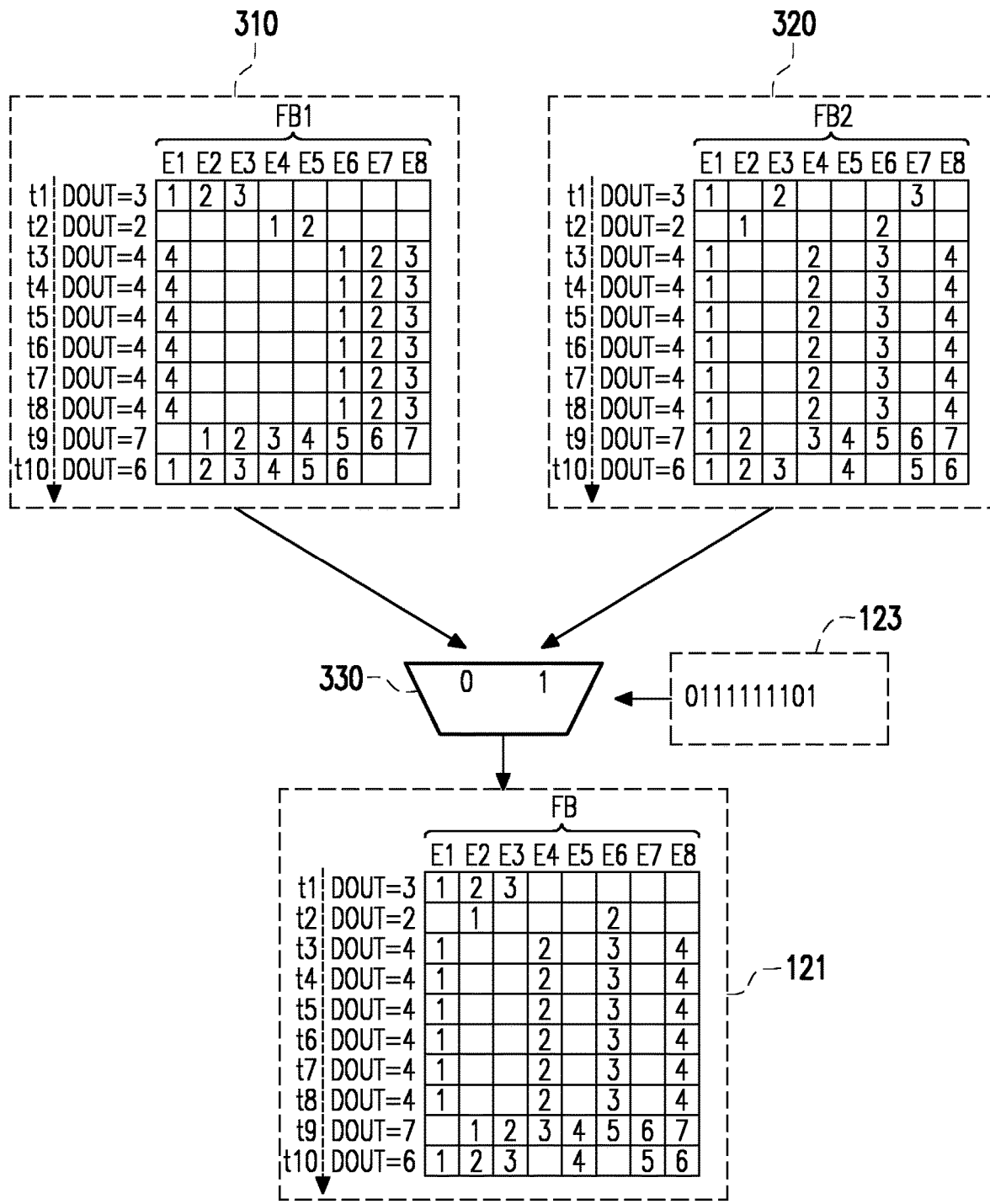
FIG. 6 is a schematic diagram of a switching operation of the Σ-Δ ADC of FIG. 3 in a mute period according to an embodiment of the invention.

FIG. 6 is a schematic diagram of a switching operation of the Σ-Δ ADC 120 of FIG. 3 in the mute period according to an embodiment of the invention. The table shown in FIG. 5 and related description of time are also adapted to the embodiment of FIG. 6, so that details thereof are not repeated.

The control circuit 123 may listen to the digital signal DOUT to detect the mute period. In the embodiment of FIG. 6, when the digital signal DOUT is kept to a median value (for example, "4") in a value range of the digital signal DOUT within a period of time, the control circuit 123 may determine that the digital signal DOUT is in the mute period (i.e. the analog signal AIN is in the mute period). It is assumed that the control circuit 123 detects that the mute period is from the time point t4 to the time point t8. During the mute period, the control circuit 130 may disable the first DEM circuit 310 and the second DEM circuit 320. Therefore, the first DEM circuit 310 may suspend a progress of the DWA algorithm (the first DEM algorithm) during the mute period, and the second DEM circuit 320 may suspend a progress of the tree structured algorithm (the second DEM algorithm) during the mute period. During the mute period, the control circuit 123 may further control the switching circuit 330 to keep a previous state during the mute period, namely, to take one of the first feedback signal FB1 and the second feedback signal FB2 as the feedback signal FB, as shown in FIG. 6. Therefore, the power consumption of the DEM circuit 122 during the mute period may be decreased.

After the mute period is ended, the control circuit 123 may enable the first DEM circuit 310 and the second DEM circuit 320 during a normal operation period to restore the progresses of the DWA algorithm and the tree structured algorithm. Based on the control of the control circuit 123, the switching circuit 330 may dynamically select one of the first feedback signal FB1 and the second feedback signal FB2 to serve as the feedback signal FB during the normal operation period.

According to different design requirements, the control circuit 123, the first DEM circuit 310 and/or the second DEM circuit 320 may be implemented by hardware, firmware, software (i.e. programs) or a combination thereof.

Regarding the hardware implementation, the control circuit 123, the first DEM circuit 310 and/or the second DEM circuit 320 may be implemented as logic circuits of an integrated circuit. Related functions of the control circuit 123, the first DEM circuit 310 and/or the second DEM circuit 320 may be implemented as hardware by using hardware description languages such as Verilog HDL or VHDL or other suitable programming languages. For example, related functions of the control circuit 123, the first DEM circuit 310 and/or the second DEM circuit 320 may be implemented as various logic blocks, modules and circuits in one or a plurality of controllers, microcontrollers, microprocessors, Application-specific integrated circuits (ASIC), Digital Signal Processors (DSP), Field Programmable Gate Arrays (FPGA) and/or other processing units.

Regarding the software and/or firmware implementation, related functions of the control circuit 123, the first DEM circuit 310 and/or the second DEM circuit 320 may be implemented as programming codes. For example, general programming languages (for example, C, C++ or a combination thereof) or other proper programming languages may be used to implement the related functions of the control circuit 123, the first DEM circuit 310 and/or the second DEM circuit 320. The programming codes may be recorded/stored in a recording medium, and the recording medium, for example, includes a Read Only Memory (ROM), a storage device and/or a Random Access Memory (RAM). A computer, a Central Processing Unit (CPU), a controller, a microcontroller or a microprocessor may read the programming codes from the recording medium and execute the same to achieve the related functions. The recording medium may be a non-transitory computer readable medium, such as a tape, a disk, a card, a semiconductor memory, a programmable logic circuit, etc. Moreover, the programs may be provided to the computer (or CPU) through any transmission medium (a communication network or a radio wave, etc.). The communication network is, for example, the Internet, wired communication, wireless communication or other communication medium.

In summary, in some embodiments of the invention, the $\Sigma$-$\Delta$ ADC 120 and the operation method thereof are capable of disabling the DEM circuit 122 during the mute period, so as to suspend the progress of the DEM algorithm. Therefore, the power consumption of the DEM circuit 122 during the mute period may be decreased. In some other embodiments of the invention, the $\Sigma$-$\Delta$ ADC 120 and the operation method thereof are capable of performing two (or more) DEM algorithms to generate two (or more) feedback signals. The $\Sigma$-$\Delta$ ADC 120 may dynamically select (switch) one of the feedback signals to the $\Sigma$-$\Delta$ modulator 121. Namely, the feedback signal FB received by the $\Sigma$-$\Delta$ modulator 121 is mixed with output codes of different DEM algorithms. Therefore, compared to the general $\Sigma$-$\Delta$ ADC, a Spur-Free Dynamic Range (SFDR) performance of the $\Sigma$-$\Delta$ ADC 120 of the embodiment of the invention is better.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A Sigma-Delta ($\Sigma$-$\Delta$) analog-to-digital converter, comprising:
a $\Sigma$-$\Delta$ modulator, having an input terminal for receiving an analog signal, and configured to convert the analog signal into a digital signal according to a feedback signal;
a dynamic element matching circuit, coupled to the $\Sigma$-$\Delta$ modulator to receive the digital signal, and configured to perform at least one dynamic element matching algorithm on the digital signal to generate the feedback signal, and provide the feedback signal to the $\Sigma$-$\Delta$ modulator; and
a control circuit, coupled to the $\Sigma$-$\Delta$ modulator to receive the digital signal, wherein the control circuit listens to the digital signal to detect a mute period, and the control circuit disables the dynamic element matching circuit during the mute period to suspend a progress of the at least one dynamic element matching algorithm.

2. The $\Sigma$-$\Delta$ analog-to-digital converter as claimed in claim 1, wherein the control circuit enables the dynamic element matching circuit to restore the progress of the at least one dynamic element matching algorithm after the mute period is ended.

3. The $\Sigma$-$\Delta$ analog-to-digital converter as claimed in claim 1, wherein the dynamic element matching circuit comprises:
a first dynamic element matching circuit, having an input terminal coupled to the $\Sigma$-$\Delta$ modulator to receive the digital signal, wherein the first dynamic element matching circuit performs a first dynamic element matching algorithm on the digital signal to generate a first feedback signal;
a second dynamic element matching circuit, having an input terminal coupled to the $\Sigma$-$\Delta$ modulator to receive the digital signal, wherein the second dynamic element matching circuit performs a second dynamic element matching algorithm different to the first dynamic element matching algorithm on the digital signal to generate a second feedback signal; and
a switching circuit, having a common terminal coupled to the $\Sigma$-$\Delta$ modulator to provide the feedback signal, wherein a first selection terminal of the switching circuit is coupled to the first dynamic element matching circuit to receive the first feedback signal, and a second selection terminal of the switching circuit is coupled to the second dynamic element matching circuit to receive the second feedback signal.

4. The $\Sigma$-$\Delta$ analog-to-digital converter as claimed in claim 3, wherein the first dynamic element matching algorithm comprises a bit continuity algorithm, and the second dynamic element matching algorithm comprises a bit dispersion algorithm.

5. The $\Sigma$-$\Delta$ analog-to-digital converter as claimed in claim 4, wherein the bit continuity algorithm comprises a data weighted averaging algorithm, and the bit dispersion algorithm comprises a tree structured algorithm.

6. The $\Sigma$-$\Delta$ analog-to-digital converter as claimed in claim 3, wherein the first dynamic element matching circuit is controlled by the control circuit, and the control circuit disables the first dynamic element matching circuit during the mute period to suspend a progress of the first dynamic element matching algorithm.

7. The $\Sigma$-$\Delta$ analog-to-digital converter as claimed in claim 3, wherein the second dynamic element matching circuit is controlled by the control circuit, and the control circuit disables the second dynamic element matching circuit during the mute period to suspend a progress of the second dynamic element matching algorithm.

8. The $\Sigma$-$\Delta$ analog-to-digital converter as claimed in claim 3, wherein the switching circuit is controlled by the control circuit, the control circuit controls the switching circuit to dynamically select one of the first feedback signal and the second feedback signal to serve as the feedback signal during a normal operation period, and the control circuit controls the switching circuit to keep taking one of the first feedback signal and the second feedback signal to serve as the feedback signal during the mute period.

9. An operation method of a Σ-Δ analog-to-digital converter, comprising:
converting an analog signal into a digital signal by a Σ-Δ modulator according to a feedback signal;
performing at least one dynamic element matching algorithm on the digital signal by a dynamic element matching circuit to generate the feedback signal;
providing the feedback signal to the Σ-Δ modulator by the dynamic element matching circuit;
listening to the digital signal by a control circuit to detect a mute period; and
disabling the dynamic element matching circuit by the control circuit during the mute period to suspend a progress of the at least one dynamic element matching algorithm.

10. The operation method of the Σ-Δ analog-to-digital converter as claimed in claim 9, further comprising:
enabling the dynamic element matching circuit by the control circuit to restore the progress of the at least one dynamic element matching algorithm after the mute period is ended.

11. The operation method of the Σ-Δ analog-to-digital converter as claimed in claim 9, wherein the operation of performing the at least one dynamic element matching algorithm comprises:
performing a first dynamic element matching algorithm on the digital signal by a first dynamic element matching circuit to generate a first feedback signal;
performing a second dynamic element matching algorithm different to the first dynamic element matching algorithm on the digital signal by a second dynamic element matching circuit to generate a second feedback signal; and
dynamically selecting one of the first feedback signal and the second feedback signal to serve as the feedback signal by a switching circuit.

12. The operation method of the Σ-Δ analog-to-digital converter as claimed in claim 11, wherein the first dynamic element matching algorithm comprises a bit continuity algorithm, and the second dynamic element matching algorithm comprises a bit dispersion algorithm.

13. The operation method of the Σ-Δ analog-to-digital converter as claimed in claim 12, wherein the bit continuity algorithm comprises a data weighted averaging algorithm, and the bit dispersion algorithm comprises a tree structured algorithm.

14. The operation method of the Σ-Δ analog-to-digital converter as claimed in claim 11, further comprising:
disabling the first dynamic element matching circuit by the control circuit during the mute period to suspend a progress of the first dynamic element matching algorithm.

15. The operation method of the Σ-Δ analog-to-digital converter as claimed in claim 11, further comprising:
disabling the second dynamic element matching circuit by the control circuit during the mute period to suspend a progress of the second dynamic element matching algorithm.

16. The operation method of the Σ-Δ analog-to-digital converter as claimed in claim 11, further comprising:
controlling the switching circuit by the control circuit to dynamically select one of the first feedback signal and the second feedback signal to serve as the feedback signal during a normal operation period; and
controlling the switching circuit by the control circuit to keep taking one of the first feedback signal and the second feedback signal to serve as the feedback signal during the mute period.

17. A Σ-Δ analog-to-digital converter, comprising:
a Σ-Δ modulator, having an input terminal for receiving an analog signal, and configured to convert the analog signal into a digital signal according to a feedback signal;
a first dynamic element matching circuit, having an input terminal coupled to the Σ-Δ modulator to receive the digital signal, wherein the first dynamic element matching circuit is configured to perform a first dynamic element matching algorithm on the digital signal to generate a first feedback signal;
a second dynamic element matching circuit, having an input terminal coupled to the Σ-Δ modulator to receive the digital signal, wherein the second dynamic element matching circuit is configured to perform a second dynamic element matching algorithm different to the first dynamic element matching algorithm on the digital signal to generate a second feedback signal; and
a switching circuit, having a common terminal coupled to the Σ-Δ modulator to provide the feedback signal, wherein a first selection terminal of the switching circuit is coupled to the first dynamic element matching circuit to receive the first feedback signal, and a second selection terminal of the switching circuit is coupled to the second dynamic element matching circuit to receive the second feedback signal.

18. The Σ-Δ analog-to-digital converter as claimed in claim 17, wherein the first dynamic element matching algorithm comprises a bit continuity algorithm, and the second dynamic element matching algorithm comprises a bit dispersion algorithm.

19. The Σ-Δ analog-to-digital converter as claimed in claim 18, wherein the bit continuity algorithm comprises a data weighted averaging algorithm, and the bit dispersion algorithm comprises a tree structured algorithm.

20. The Σ-Δ analog-to-digital converter as claimed in claim 17, wherein the first dynamic element matching circuit suspends a progress of the first dynamic element matching algorithm during a mute period.

21. The Σ-Δ analog-to-digital converter as claimed in claim 17, wherein the second dynamic element matching circuit suspends a progress of the second dynamic element matching algorithm during a mute period.

22. The Σ-Δ analog-to-digital converter as claimed in claim 17, wherein the switching circuit dynamically selects one of the first feedback signal and the second feedback signal to serve as the feedback signal during a normal operation period, and the switching circuit keeps taking one of the first feedback signal and the second feedback signal to serve as the feedback signal during a mute period.

23. An operation method of a Σ-Δ analog-to-digital converter, comprising:
converting an analog signal into a digital signal by a Σ-Δ modulator according to a feedback signal;
performing a first dynamic element matching algorithm on the digital signal by a first dynamic element matching circuit to generate a first feedback signal;
performing a second dynamic element matching algorithm different to the first dynamic element matching algorithm on the digital signal by a second dynamic element matching circuit to generate a second feedback signal; and dynamically selecting one of the first feedback signal and the second feedback signal by the switching circuit to serve as the feedback signal.

24. The operation method of the Σ-Δ analog-to-digital converter as claimed in claim 23, wherein the first dynamic element matching algorithm comprises a bit continuity algorithm, and the second dynamic element matching algorithm comprises a bit dispersion algorithm.

25. The operation method of the Σ-Δ analog-to-digital converter as claimed in claim 24, wherein the bit continuity algorithm comprises a data weighted averaging algorithm, and the bit dispersion algorithm comprises a tree structured algorithm.

26. The operation method of the Σ-Δ analog-to-digital converter as claimed in claim 23, further comprising:
   suspending a progress of the first dynamic element matching algorithm by the first dynamic element matching circuit during a mute period.

27. The operation method of the Σ-Δ analog-to-digital converter as claimed in claim 23, further comprising;
   suspending a progress of the second dynamic element matching algorithm by the second dynamic element matching circuit during a mute period.

28. The operation method of the Σ-Δ analog-to-digital converter as claimed in claim 23, further comprising:
   dynamically selecting one of the first feedback signal and the second feedback signal to serve as the feedback signal by the switching circuit during a normal operation period; and
   keeping taking one of the first feedback signal and the second feedback signal to serve as the feedback signal by the switching circuit during a mute period.

\* \* \* \* \*